(12) United States Patent
Makhija

(10) Patent No.: US 7,078,879 B2
(45) Date of Patent: Jul. 18, 2006

(54) METHOD AND APPARATUS FOR TESTING AND CHARGING A POWER SOURCE

(75) Inventor: Surender K. Makhija, Brookfield, WI (US)

(73) Assignee: SPX Corporation, Charlotte, NC (US)

( * ) Notice: Subject to any disclaimer, the term of this patent is extended or adjusted under 35 U.S.C. 154(b) by 39 days.

(21) Appl. No.: 10/105,420

(22) Filed: Mar. 26, 2002

(65) Prior Publication Data

US 2003/0184262 A1    Oct. 2, 2003

(51) Int. Cl.
*H02J 7/00*    (2006.01)
*H02J 7/16*    (2006.01)

(52) U.S. Cl. .................... 320/133; 320/106; 320/110

(58) Field of Classification Search ............... 320/106, 320/110, 132, 133; 324/326
See application file for complete search history.

(56) References Cited

U.S. PATENT DOCUMENTS

| 4,423,378 A | | 12/1983 | Marino et al. | ............... 324/427 |
| 5,583,416 A | | 12/1996 | Klang | ........................ 320/22 |
| 5,589,757 A | | 12/1996 | Klang | ........................ 320/22 |
| 5,757,192 A | * | 5/1998 | McShane et al. | ........... 324/427 |
| 5,821,756 A | * | 10/1998 | McShane et al. | ........... 324/430 |
| 6,037,778 A | | 3/2000 | Makhija | ..................... 324/433 |
| 6,144,185 A | * | 11/2000 | Dougherty et al. | ......... 320/132 |

* cited by examiner

*Primary Examiner*—Bao Q. Vu
(74) *Attorney, Agent, or Firm*—Baker & Hostetler LLP

(57) ABSTRACT

A battery tester and charger is provided for safely and efficiently testing and charging partially charged and discharged batteries. Information about the battery to be tested is inputed by the user. A first heavy loaded is applied and the bounce back voltage is used to determine the state of charge of the battery. If the battery is chargeable then a set charge time is determined. If not, then the battery can be discarded.

27 Claims, 4 Drawing Sheets

METHOD AND APPARATUS FOR TESTING AND CHARGING A POWER SOURCE

FIELD OF THE INVENTION

The present invention relates generally to the field of battery testers and chargers. More particularly, the present invention relates to a device and method for rapidly and efficiently testing and charging batteries.

BACKGROUND OF THE INVENTION

Rechargeable batteries are an important source of clean portable power in a wide variety of electrical applications, including automobiles, boats and electric vehicles. Lead-acid batteries are one form of rechargeable battery that are commonly used to start engines, propel electric vehicles, and to act as non-interruptible sources of back-up power when an external supply of electricity is interrupted. While not particularly energy efficient, because of the weight of lead in comparison to other metals, the technology of lead-acid batteries is mature and, as a result, they are cheap, reliable, and readily produced and thus, continue to constitute a substantial portion of the rechargeable batteries being produced today.

The ability of lead-acid batteries to deliver large amounts of electrical power is well known, particularly when associated with the starting and powering of motor vehicles. Likewise, the need to test and recharge these batteries and the problems associated therewith are also well known. A number of battery testers and chargers have thus been developed.

Most conventional battery chargers are equipped to provide multiple charging rates for charging different size batteries. The multiple charging rates are achieved by varying the charging voltage at the battery terminals, generally by changing the transformer primary/secondary winding ratio. An operator manually selects the rate at which the battery should be charged and also the duration of the charge cycle if the charger is equipped with a timer function. Most conventional chargers do not, however, have an option for selecting the type of battery to be charged (e.g., Gell Cell, Deep Cycle, Flooded Lead Acid, Spiral Wound, etc.) As a result, chargers are typically configured to work for many types of batteries but is not optimal for all or any of these types.

Many faults found in lead-acid batteries and other types of batteries are the result of poor recharging control in conventional chargers. For example, an operator may undercharge or overcharge the battery at a very high rate resulting in the deterioration of the battery. Overcharging a battery wastes energy, reduces the life of the battery, and may permanently damage the battery. In addition, overcharging can accelerate deterioration of the battery condition.

Another drawback of conventional chargers is that they do not provide a mechanism for testing the condition including, for instance, the state of charge of the battery prior to charging. Without testing, operators do not know the current state of charge in a battery, how long and at what rate a particular battery should be charged, whether it is safe to charge the battery, and whether the battery is capable of accepting a charge.

A need still exists therefore for a battery charger that provides optimal charging for different types of batteries, provides improved recharging control, and can test the battery to be charged to determine the condition of the battery before charging.

SUMMARY OF THE INVENTION

The foregoing need has been met by the present invention, wherein in one aspect of the invention, a method is provided to analyze and charge a power source or battery. The method includes entering information corresponding to a battery to be charged into a battery charger. A first heavy load test is then performed on the battery to determine whether the battery can be charged and, if so, how it should be charged. Next a set charge time is then determined for the battery being charged. The battery is then charged for the set charge time and a second heavy load test is performed on the battery to determine whether the battery can deliver the required power. Further, a micro-load test is also performed on the battery to make sure that the presence of surface charge does not influence the results of the heavy load tests. The battery charging is then completed.

In another aspect of the invention, a battery charger is provided which includes means for entering information corresponding to a battery to be charged into the battery charger. A means for performing a first heavy load test on the battery is also provided to determine whether the battery can be charged and how it should be charged. Also included is a means for determining a set charge time for the battery and a means for charging the battery for the set charge time. Means are also provided for performing a second heavy load test and a micro-load test on the battery to determine whether the battery can deliver the required power and to make sure that the presence of surface charge does not influence the results of the heavy load tests. Means are also provided for completing charging of the battery.

There has thus been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended hereto.

In this respect, before explaining at least one embodiment of the invention in detail, it is to be understood that the invention is not limited in its application to the arrangements of the components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF PREFERRED EMBODIMENTS OF THE INVENTION

Figure 1:
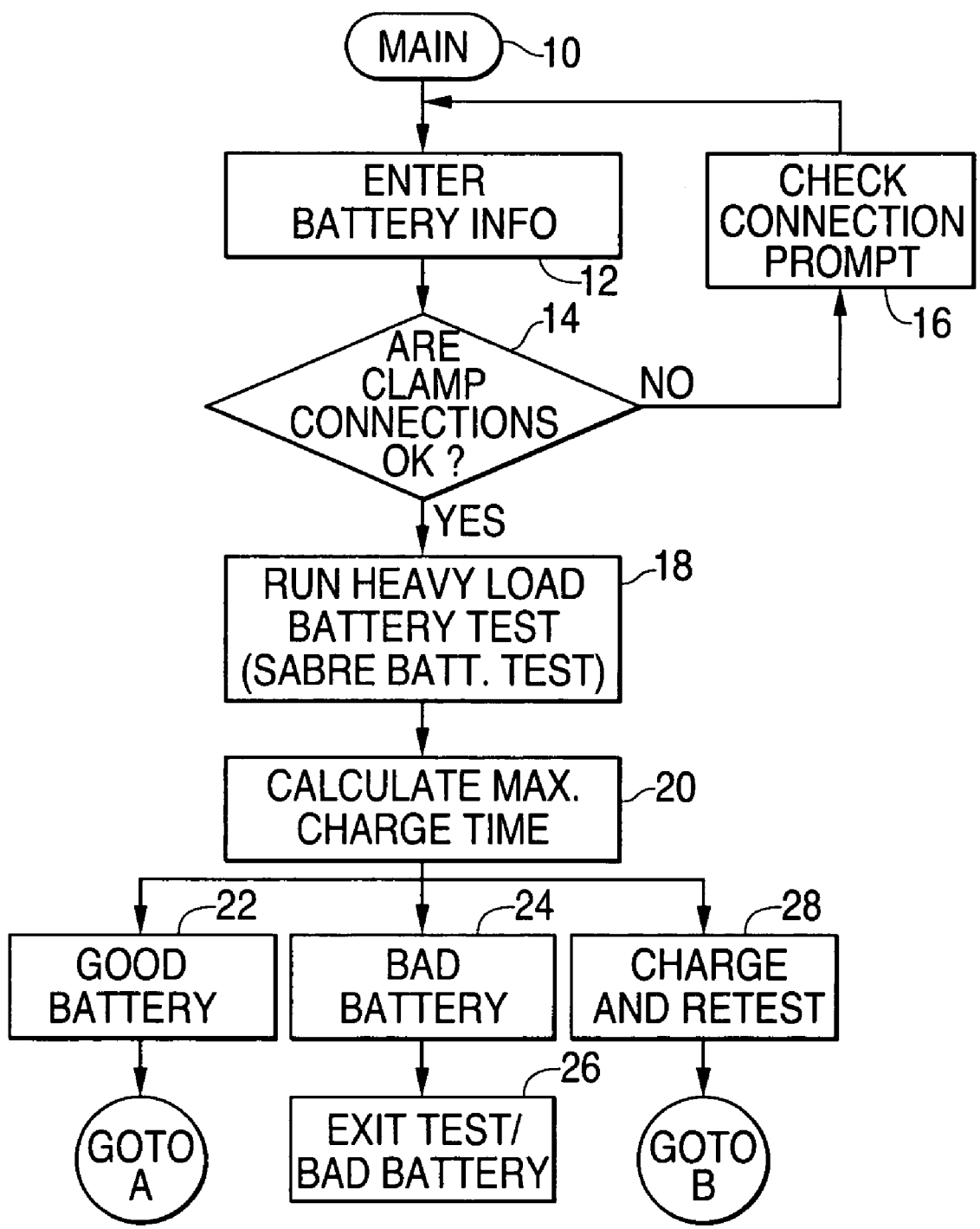
FIG. 1 is a flowchart of a portion of the method for testing and charging batteries in accordance with a preferred embodiment of the present invention.

Referring now to the figures, in FIG. 1 there is shown a flowchart of a portion of the method of a preferred embodiment of the present invention for testing and charging batteries. The method, as depicted in FIG. 1, begins by powering up the battery tester/charger 10. The user is then prompted to input data corresponding to a battery to be tested 12. The data corresponding to the battery can include such information as the battery type, the date code for the battery that is assigned when the battery is produced, and/or the size of the battery (measured in cold cranking amps, amp-hours or other selected units).

This information is one way for the inventor to determine information such as maximum voltage peak level at which it can be charged without damaging the battery. Moreover, this information aids the invention in determining the optimum charge rate for achieving the maximum voltage peak level in the most efficient way possible.

While a battery may originally be built to produce a certain voltage or to handle charging up to its manufactured voltage level, there is no guarantee that the battery will continually perform in accordance with these specifications. (This, for example, may be due to the deterioration in the condition of the battery.)

Hence, the invention analyzes the charge state of a given type of battery, determines whether the battery is defective and, if not, charges the battery at its most optimum charge rate up to its maximum allowed charging volts. Furthermore, the invention executes the aforementioned analysis, determination, and charging in the safest and most optimal time possible. The method and apparatus by which the aforesaid is performed is described below.

The invention ensures that the terminals of the battery are properly connected to the tester charger, i.e., that the connections are tight and that the polarity is correct 14. Systems and methods for checking the connections of battery terminals in tester/charger devices are well known and thus, will not be described in detail herein.

If the connections are not acceptable, the user will be prompted to check the connections 16. If the connections are acceptable, the invention performs a heavy load test 18 to determine the condition of the battery. Some of the conditions that are analyzed are the battery's capability of holding a charge, the number of bad cells, and whether the battery can be safely recharged. It should be recognized, however, that the invention is not limited to these tests.

Figure 4:
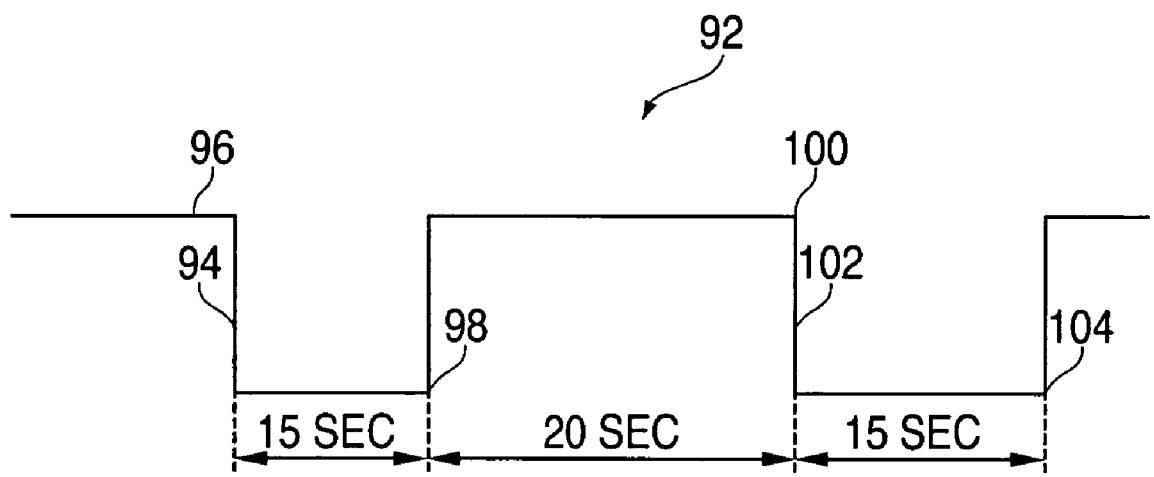
FIG. 4 is a diagram of the process for applying a load to an open circuit in accordance with a preferred embodiment of the present invention.

In a preferred embodiment of the invention, a Sabre Battery Test procedure is used as the heavy load test to analyze the condition of the battery as shown in the Sabre Test Timing Diagram 92 in FIG. 4. The Sabre Battery Test requires an applied load 94 to be placed on an open circuit 96. A battery voltage reading ("LVA15") 98 can be taken at the end of the applied load 94 which is approximately fifteen seconds after the load 94 is applied and released. A bounce back voltage measurement ("Rv") 100 is taken twenty seconds after the applied load 94, is turned off. A second applied load 102 is then placed on the open circuit and maintained for fifteen seconds. Another battery voltage reading ("LVB15") 104 is taken at the end of the second applied load 102.

Heavy load tests are highly accurate for testing charged batteries. If the battery to be tested is partially charged, then the test accurately determines whether the battery is defective. It should be recognized, however, that any heavy load test procedure which suitable for testing the condition of the battery may be used.

If the condition of the battery is such that the battery can be recharged, the invention then calculates a set time to charge the battery 20. If LVB15 is less than 4.0 volts, the set time, i.e., maximum charge time, equals forty five minutes. If LVB15 is equal to or greater than 4.0 volts, the set charge time is calculated as follows:

Set time=(12.5−$V_{ss}$)*56.25 minutes

Where, $V_{ss}$=bounce back voltage ("$Rv$")

if $11.7V <= Rv <= 12.5V$ $V_{ss} = 12.5V$ if $Rv > 12.5V$ $V_{ss} = 11.7V$ if $Rv < 11.7V$

By applying the heavy load test and monitoring the bounce back voltage, the invention calculates the state of charge of the battery and the set time required to charge the battery while maintaining an optimum charge rate. The invention controls the optimum charge rate by precisely controlling the charging voltage throughout the charging cycle. This is based on the maximum allowed charging volts for the given type of battery under test.

If the battery condition is not bad 22, as determined by the heavy load test 18 (e.g., Sabre Battery Test), further testing and charging will be performed as described below. If the battery condition is determined to be faulty 24, the testing is terminated, and the battery can be discarded 26. Hence, no further time is wasted by attempting to charge the battery determined to be defective. If the heavy load test is unable to determine the condition of the battery, the battery will be charged and retested 28 in the manner to be described below. One of the reasons in not being able to determine the condition of the battery can be attributed to the battery not being sufficiently charged.

Figure 2:
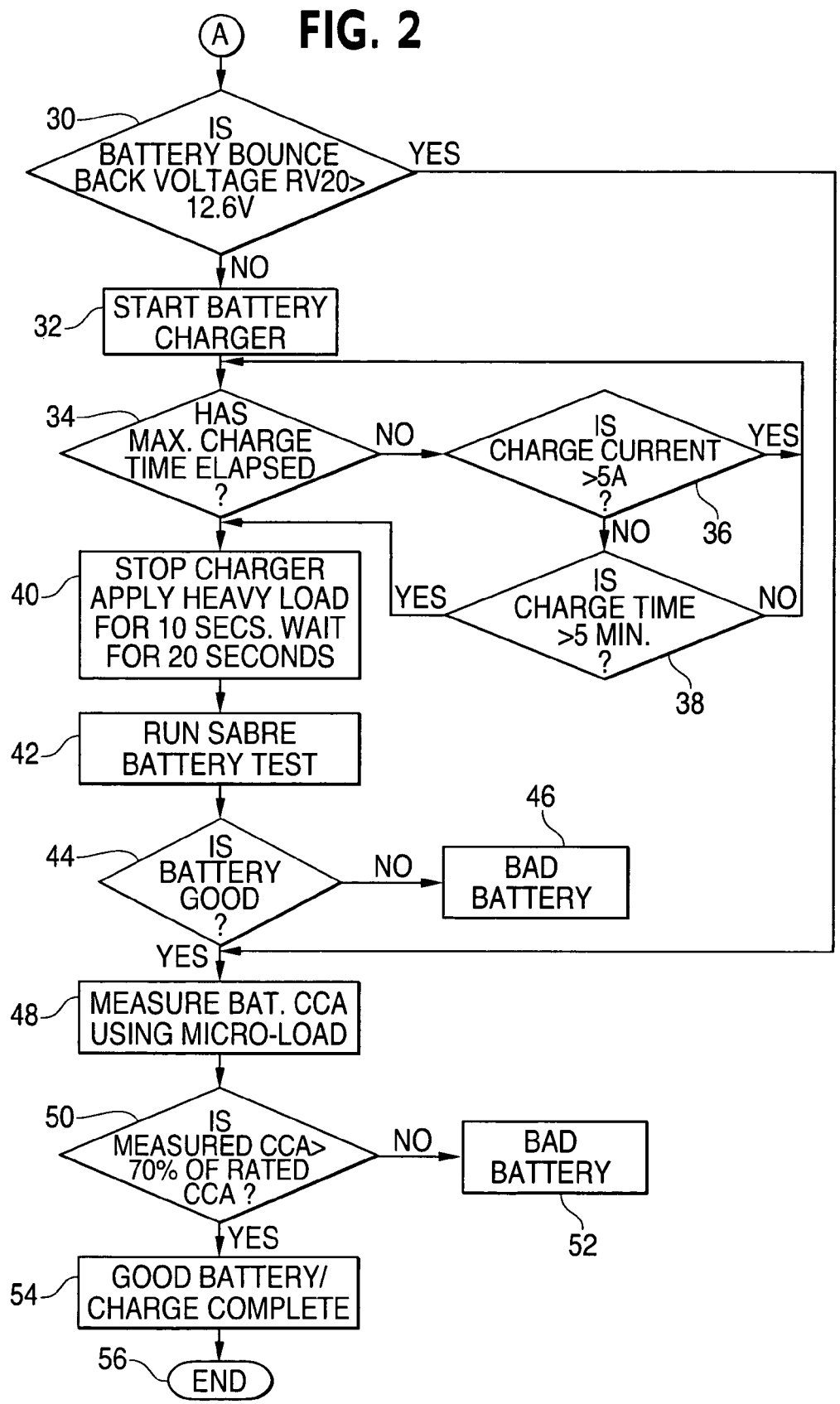
FIG. 2 is a flowchart of the process for testing and charging partially charged batteries in accordance with a preferred embodiment of the present invention.

If the battery condition is determined to be functional 22, additional testing and charging are performed as depicted in FIG. 2. The first step in this testing is to determine whether the bounce back voltage is greater than 12.6 volts 30. The bounce back voltage is a measure of the state of battery charge. If the bounce back voltage is determined to be greater than 12.6 volts, the battery tester/charger will perform a micro-load test as described below. If the bounce back voltage is equal to or less than 12.6 volts, the invention is activated 32 to charge the battery for a set time 34.

While the battery is being charged 32, the current is monitored. If the charge is greater than five amps, the charger continues to charge for the set time. If the current is less than or equal to five amps, the charger continues to charge the battery for a minimum of at least five minutes.

Once the set time, or five minutes of charging, is reached, the charger turns off. A heavy load test is applied to the battery for at least ten seconds followed by the load being removed for at least twenty seconds 40. The previous application and removal of the heavy load is important to condition the battery by stabilizing the battery voltage. Another heavy load test is then performed on the battery 42.

The tester then determines from the heavy load test 42 if the battery is not bad 44. If the battery is determined to be faulty or bad 46, the testing is terminated and the battery discarded. If the battery is determined to be functional, or if the bounce back voltage is greater than 12.6 volts, the cold cranking amps ("CCA") are measured using a micro-load test.

In the preferred embodiment, a micro-load test is performed after the battery is determined to be functional. This test is performed by applying a smaller load (approximately twenty to sixty amps) for a preset duration (approximately 250 milliseconds to one second) and measuring the battery voltage under load and after the removal of the load. It should be recognized that other micro-load tests could be substituted for the micro-load test described above. For example, a dual micro-load test can also be used.

Figure 3:
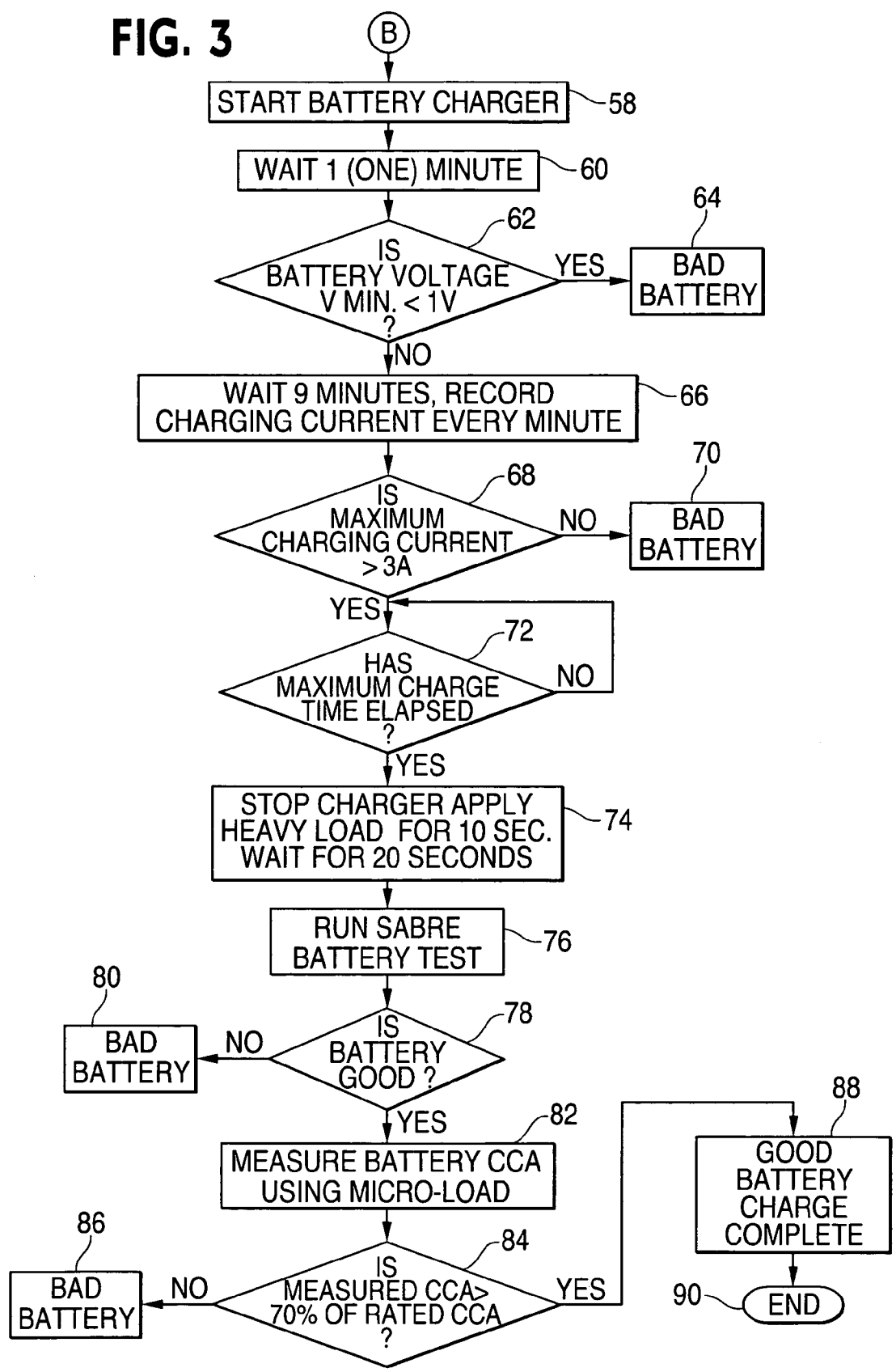
FIG. 3 is a flowchart of the process for testing and charging discharged batteries in accordance with a preferred embodiment of the present invention.

If the condition of the battery can not be determined from the heavy load test 18, FIG. 1, the invention will charge the battery and retest it in accordance with the method depicted in FIG. 3. One reason for a non-determinate result is due to the battery being discharged For re-testing, the battery charger is activated 58 first. The invention then charges the battery for one minute 60. The battery voltage is read after one minute 62. If the battery voltage is less than one volt after one minute, the charger is turned off and the battery will be discarded 64.

If the voltage is equal to or exceeds one volt after one minute of charging, the charger will continue to charge for nine minutes 68. During the nine minutes of charging, the charging current is read at one minute intervals to determine if the charging current exceeds three amps 68. If the charging current is equal to or does not exceed three amps, the battery is determined to be bad and the charger is turned off and the battery is discarded 70.

If the charger current does exceed three amps, the charger will continue to charge for the set period of time as calculated above 72. The charger is then turned off and a heavy load is applied to the battery for a period of ten seconds to condition the battery and then removed for a period of twenty seconds 74 for the battery voltage to stabilize. A heavy load test (e.g., Sabre Battery Test) is then performed 76.

The invention then determines whether the battery is bad 78. If the battery is determined to be bad, it is discarded 80. If the battery is determined to be functional, the CCA is then measured using the micro-load test 82. The measured CCA is then compared to the rated CCA for the battery 84. In the preferred embodiment of the invention, if the measured CCA is less than or equal to approximately seventy percent of the rated CCA for the battery, then the battery is determined to be bad 86. If the measured CCA is greater than approximately seventy percent of the CCA, then the battery is determined to be good 88 and the tester/charger is turned off 90.

A battery tester/charger for performing the processes described herein can be readily constructed using discrete electrical components, such as resistors, for providing the heavy load and micro-load testing. Control of the test processes and measurements can be readily implemented using microprocessors, ASICs or other control logic. Input to the tester/charger device can be through a keyboard, bar code reader (for directly inputting data corresponding to a battery), battery temperature reader, rheostat, or other conventional means. It is intended that the invention not be limited to any particular construction by covering any device which performs the processes described above.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

For example, it should be readily understood that specific times and voltages provided above are exemplary and should not be viewed as limiting the invention. Other voltage readings, charge times, and measurements may also be used in the testing and charging procedure of this invention.

What is claimed is:

1. A method of charging batteries, comprising the steps of:
   entering information corresponding to a vehicle battery to be charged into a battery charger;
   performing a first heavy load test on the vehicle battery to determine whether a bounce back voltage is less than or greater than 12.6 volts;
   determining a condition of the vehicle battery to determine whether the vehicle battery can be charged based upon the first heavy load test;
   determining an optimum charge rate based upon the condition of the vehicle battery;
   determining a set charge time for the vehicle battery based upon the first heavy load test; and
   charging the vehicle battery for the set charge time at the optimum charge rate if the bounce back voltage is less than 12.6 volts.

2. The method of claim 1 wherein said information corresponding to said battery includes battery type.

3. The method of claim 1 wherein the first heavy load test comprises:
   applying a first load to the vehicle battery and releasing a first load after a first prescribed time;
   measuring a first battery voltage after said first prescribed time;
   measuring a bounce back voltage at a second prescribed time after said first prescribed time;
   applying a second load to the battery and releasing the second load after a third prescribed time; and
   measuring a second battery voltage after the third prescribed time.

4. The method of claim 1 wherein when the bounce back voltage is greater than 12.6 volts, the method further comprises:
   measuring the battery cold cranking amps ("CCA") value by applying a micro-load test to the battery; and
   determining the condition of the battery based upon said battery CCA value.

5. The method of claim 4 wherein a measured CCA value constitutes that the battery is good and charging is complete.

6. The method of claim 5 wherein the battery is good when the measured CCA value is greater than approximately 70% of a rated CCA value.

7. The method of claim 1 further comprising:
   performing a second heavy load test on said battery to determine whether the battery accepts charge;
   performing a micro load test on said battery to determine the condition of the battery; and
   completing charging of said battery.

8. The method of claim 7 wherein said second heavy load test comprises:

applying a first heavy load for a first preset time;
waiting a second preset time;
applying a second heavy load for a third preset time; and
determining the condition of the battery.

9. The method of claim 7 wherein a determination that the battery is in good condition further comprises:
measuring a CCA value of the battery by applying a micro-load to the battery; and
determining whether the condition of the battery based upon said battery CCA value.

10. A battery charger, comprising:
means for entering information corresponding to a vehicle battery to be charged into the battery charger;
means for determining a connection between the battery and the battery charger;
means for performing a first heavy load test on said battery to determine whether a bounce back voltage is less than or greater than 12.6 volts;
means for determining a condition of the battery to determine whether the battery can be charged based upon the first heavy load test;
means for determining an optimum charge rate based upon the condition of the battery;
means for determining a set charge time for the battery based upon the first heavy load test; and
means for charging the battery for the set charge time at the optimum charge rate when the bounce back voltage is less than 12.6 volts.

11. The battery charger of claim 10 wherein said information corresponding to said battery includes battery type.

12. The battery charger of claim 10 wherein the first heavy load test comprises:
applying a first load to the battery and releasing a first load after a first prescribed time;
measuring a first battery voltage after said first prescribed time;
measuring a bounce back voltage at a second prescribed time after said first prescribed time;
applying a second load to the battery and releasing the second load after a third prescribed time; and
measuring a second battery voltage after the third prescribed time.

13. The battery charger of claim 10 further comprises:
means for measuring the battery cold cranking amps ("CCA") value by applying a micro-load test to the battery; and
means for determining the condition of the battery based upon said battery CCA value.

14. The battery charger of claim 13 wherein a measured CCA value constitutes that the battery is good and charging is complete.

15. The battery charger of claim 14 wherein the battery is good when the measured CCA value is greater than approximately 70% of a rated CCA value.

16. The battery charger of claim 10 further comprising:
means for performing a second heavy load test on said battery to determine whether the battery accepts charge;
means for performing a micro load test on said battery to determine the condition of the battery; and
means for completing charging of said battery.

17. The battery charger of claim 16 wherein said second heavy load test comprises:
means for applying a first heavy load for a first preset time;
means for waiting a second preset time;
means for applying a second heavy load for a third preset time; and
means for determining the condition of the battery.

18. The battery charger of claim 16 wherein a determination that the battery is in good condition further comprises:
means for measuring a CCA value of the battery by applying a micro-load to the battery; and
means for determining whether the condition of the battery based upon said battery CCA value.

19. A method of charging batteries, comprising the steps of:
performing a first heavy load test on a vehicle battery to determine whether a bounce back voltage is less than or greater than 12.6 volts;
determining a condition of the battery to determine whether the battery can be charged based upon the first heavy load test;
determining an optimum charge rate based upon the condition of the battery;
determining a set charge time for the battery based upon the first heavy load test; and
charging the battery for the set charge time at the optimum charge rate when the bounce back voltage is less than 12.6 volts.

20. The method of claim 19 further comprising:
entering battery information into a battery charger.

21. The method of claim 20 further comprising:
performing a second heavy load test on said battery to determine whether the battery accepts charge.

22. The method of claim 19 further comprising:
performing a second heavy load test on said battery to determine whether the battery accepts charge.

23. The method of claim 19 further comprising:
performing a second heavy load test on said battery to determine whether the battery accepts charge;
performing a micro load test on said battery to determine the condition of the battery; and
completing charging of said battery.

24. The method of claim 20 further comprising:
performing a second heavy load test on said battery to determine whether the battery accepts charge;
performing a micro load test on said battery to determine the condition of the battery; and
completing charging of said battery.

25. An apparatus for charging batteries, comprising:
an input device for entering information corresponding to a vehicle battery to be charged into the battery charger;
a microprocessor coupled to the input device, wherein the microprocessor performs a first heavy load test on said battery and determines whether a bounce back voltage is less than or greater than 12.6 volts, to determine a condition of the battery to determine whether the battery can be charged based upon the first heavy load test, the microprocessor additionally determines an optimum charge rate based upon the condition of the battery, the microprocessor additionally determines a set charge time for the battery based upon the first heavy load test; and
a charger connected to the processor that charges the battery for the set charge time and charge rate when the bounce back voltage is less than 12.6 volts.

26. The apparatus of claim 25 wherein said information corresponding to said battery includes battery type.

27. The apparatus of claim 25 wherein said microprocessor further performs:
a second heavy load test on said battery to determine whether the battery accepts charge; and
a micro load test on said battery to determine the condition of the battery.

* * * * *

UNITED STATES PATENT AND TRADEMARK OFFICE
CERTIFICATE OF CORRECTION

| | | |
|---|---|---|
| PATENT NO. | : 7,078,879 B2 | Page 1 of 1 |
| APPLICATION NO. | : 10/105420 | |
| DATED | : July 18, 2006 | |
| INVENTOR(S) | : Surender K. Makhija | |

It is certified that error appears in the above-identified patent and that said Letters Patent is hereby corrected as shown below:

<u>Column 8</u>

Line 6, please delete "whether".

Signed and Sealed this

Seventeenth Day of October, 2006

JON W. DUDAS
*Director of the United States Patent and Trademark Office*